(12) United States Patent
Pendse et al.

(10) Patent No.: US 9,373,573 B2
(45) Date of Patent: Jun. 21, 2016

(54) SOLDER JOINT FLIP CHIP INTERCONNECTION

(71) Applicant: STATS ChipPAC, Ltd., Singapore (SG)

(72) Inventors: Rajendra D. Pendse, Fremont, CA (US); KyungOe Kim, Daegeon (KR); TaeWoo Kang, Kyoung-gi-Do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/305,185

(22) Filed: Jun. 16, 2014

(65) Prior Publication Data

US 2014/0291839 A1    Oct. 2, 2014

Related U.S. Application Data

(63) Continuation of application No. 13/367,214, filed on Feb. 6, 2012, now Pat. No. 8,810,029, which is a continuation of application No. 12/624,482, filed on Nov. 24, 2009, now Pat. No. 8,129,841, which is a (Continued)

(51) Int. Cl.
    *H01L 21/44*      (2006.01)
    *H01L 23/48*      (2006.01)
    (Continued)

(52) U.S. Cl.
CPC ........ *H01L 23/49811* (2013.01); *H01L 21/563* (2013.01); *H01L 21/76885* (2013.01);
(Continued)

(58) Field of Classification Search
CPC ................ H01L 2924/14; H01L 2924/01079; H01L 2924/01029; H01L 2924/01013; H01L 2224/16; H01L 2224/13099

USPC .................. 257/737, 734, 778, 781, E23.021; 438/107, 612, 613
See application file for complete search history.

(56) References Cited

U.S. PATENT DOCUMENTS 5,186,383 A    2/1993   Melton et al.
5,340,435 A    8/1994   Ito et al.
(Continued)

FOREIGN PATENT DOCUMENTS

JP    04-355933    9/1992
JP    2005-28037    4/1993
(Continued)

OTHER PUBLICATIONS

Chen et al., "Advanced Flip-Chip Package Production Solution for 40nm/28nm Technology Nodes", International Electron Devices Meeting, pp. 768-771, IEEE 2010.
(Continued)

*Primary Examiner* — Hsien Ming Lee
(74) *Attorney, Agent, or Firm* — Robert A. Atkins; Patent Law Group: Atkins and Associates, P.C.

(57) ABSTRACT

A flip chip interconnect has a tapering interconnect structure, and the area of contact of the interconnect structure with the site on the substrate metallization is less than the area of contact of the interconnect structure with the die pad. Also, a bond-on-lead or bond-on-narrow pad or bond on a small area of a contact pad interconnection includes such tapering flip chip interconnects. Also, methods for making the interconnect structure include providing a die having interconnect pads, providing a substrate having interconnect sites on a patterned conductive layer, providing a bump on a die pad, providing a fusible electrically conductive material either at the interconnect site or on the bump, mating the bump to the interconnect site, and heating to melt the fusible material.

24 Claims, 4 Drawing Sheets

Related U.S. Application Data continuation of application No. 11/640,468, filed on Dec. 14, 2006, now abandoned, which is a continuation-in-part of application No. 11/388,755, filed on Mar. 24, 2006, now abandoned, and a continuation-in-part of application No. 10/985,654, filed on Nov. 10, 2004, now Pat. No. 7,368,817.

(60) Provisional application No. 60/597,648, filed on Dec. 14, 2005, provisional application No. 60/665,208, filed on Mar. 25, 2005, provisional application No. 60/518,864, filed on Nov. 10, 2003, provisional application No. 60/533,918, filed on Dec. 31, 2003.

(51) Int. Cl.
  *H01L 23/52* (2006.01)
  *H01L 23/498* (2006.01)
  *H01L 21/56* (2006.01)
  *H01L 23/00* (2006.01)
  *H01L 21/768* (2006.01)
  *H01L 23/522* (2006.01)

(52) U.S. Cl.
  CPC ........ *H01L23/49838* (2013.01); *H01L 23/522* (2013.01); *H01L 24/16* (2013.01); *H01L 24/28* (2013.01); *H01L 24/81* (2013.01); *H01L 2224/1132* (2013.01); *H01L 2224/1147* (2013.01); *H01L 2224/131* (2013.01); *H01L 2224/1308* (2013.01); *H01L 2224/13082* (2013.01); *H01L 2224/13111* (2013.01); *H01L 2224/13144* (2013.01); *H01L 2224/13147* (2013.01); *H01L 2224/13155* (2013.01); *H01L 2224/16225* (2013.01); *H01L 2224/73203* (2013.01); *H01L 2224/73204* (2013.01); *H01L 2224/8121* (2013.01); *H01L 2224/81191* (2013.01); *H01L 2224/81815* (2013.01); *H01L 2224/83102* (2013.01); *H01L 2224/92125* (2013.01); *H01L 2924/00013* (2013.01); *H01L 2924/014* (2013.01); *H01L 2924/0105* (2013.01); *H01L 2924/01005* (2013.01); *H01L 2924/01006* (2013.01); *H01L 2924/01027* (2013.01); *H01L 2924/01029* (2013.01); *H01L 2924/01033* (2013.01); *H01L 2924/01046* (2013.01); *H01L 2924/01047* (2013.01); *H01L 2924/01058* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/10253* (2013.01); *H01L 2924/14* (2013.01); *H01L 2924/1433* (2013.01); *H01L 2924/3011* (2013.01); *H01L 2924/351* (2013.01)

(56) References Cited

U.S. PATENT DOCUMENTS

| | | | |
|---|---|---|---|
| 5,378,859 | A | 1/1995 | Shirasaki et al. |
| 5,383,916 | A | 1/1995 | Brown |
| 5,386,624 | A | 2/1995 | George et al. |
| 5,434,410 | A | 7/1995 | Kulwicki |
| 5,508,561 | A | 4/1996 | Tago et al. |
| 5,519,580 | A | 5/1996 | Natarajan et al. |
| 5,587,337 | A | 12/1996 | Idaka et al. |
| 5,650,595 | A | 7/1997 | Bentlage et al. |
| 5,710,071 | A | 1/1998 | Beddingfield et al. |
| 5,795,818 | A | 8/1998 | Marrs |
| 5,798,285 | A | 8/1998 | Bentlage et al. |
| 5,844,782 | A | 12/1998 | Fukasawa |
| 5,854,514 | A | 12/1998 | Roldan et al. |
| 5,869,886 | A | 2/1999 | Tokuno |
| 5,872,399 | A | 2/1999 | Lee |
| 5,889,326 | A | 3/1999 | Tanaka |
| 5,915,169 | A | 6/1999 | Heo |
| 5,985,456 | A | 11/1999 | Zhou et al. |
| 6,002,172 | A | 12/1999 | Desai et al. |
| 6,049,122 | A | 4/2000 | Yoneda |
| 6,109,507 | A | 8/2000 | Yagi et al. |
| 6,149,122 | A | 11/2000 | Berger et al. |
| 6,201,305 | B1 | 3/2001 | Darveaux et al. |
| 6,218,630 | B1 | 4/2001 | Takigami |
| 6,228,466 | B1 | 5/2001 | Tsukada et al. |
| 6,229,209 | B1 | 5/2001 | Nakamura et al. |
| 6,229,220 | B1 | 5/2001 | Saitoh et al. |
| 6,229,711 | B1 | 5/2001 | Yoneda |
| 6,251,704 | B1 | 6/2001 | Ohuchi et al. |
| 6,259,159 | B1 * | 7/2001 | Dalal et al. ............. 257/738 |
| 6,259,163 | B1 | 7/2001 | Ohuchi et al. |
| 6,278,184 | B1 * | 8/2001 | Brofman ............. B23K 1/0016 228/180.22 |
| 6,281,107 | B1 | 8/2001 | Moriyama |
| 6,281,450 | B1 | 8/2001 | Urasaki et al. |
| 6,281,581 | B1 | 8/2001 | Desai et al. |
| 6,297,560 | B1 | 10/2001 | Capote et al. |
| 6,297,564 | B1 | 10/2001 | Chung |
| 6,324,754 | B1 | 12/2001 | DiStefano et al. |
| 6,329,605 | B1 | 12/2001 | Beroz et al. |
| 6,333,206 | B1 | 12/2001 | Ito et al. |
| 6,335,222 | B1 * | 1/2002 | DiStefano ............. 438/108 |
| 6,335,568 | B1 | 1/2002 | Yuzawa et al. |
| 6,335,571 | B1 | 1/2002 | Capote et al. |
| 6,383,916 | B1 | 5/2002 | Lin |
| 6,396,707 | B1 | 5/2002 | Huang et al. |
| 6,409,073 | B1 | 6/2002 | Kaskoun et al. |
| 6,441,316 | B1 | 8/2002 | Kusui |
| 6,448,665 | B1 | 9/2002 | Nakazawa et al. |
| 6,458,622 | B1 | 10/2002 | Keser et al. |
| 6,459,622 | B1 | 10/2002 | Ogura et al. |
| 6,462,425 | B1 | 10/2002 | Iwasaki et al. |
| 6,472,608 | B2 | 10/2002 | Nakayama |
| 6,495,397 | B2 | 12/2002 | Kubota et al. |
| 6,510,976 | B2 | 1/2003 | Hwee et al. |
| 6,518,674 | B2 | 2/2003 | Interrante et al. |
| 6,518,678 | B2 | 2/2003 | James et al. |
| 6,550,666 | B2 | 4/2003 | Chew et al. |
| 6,556,268 | B1 | 4/2003 | Lee et al. |
| 6,563,712 | B2 | 5/2003 | Akram et al. |
| 6,573,610 | B1 | 6/2003 | Tsai |
| 6,578,754 | B1 | 6/2003 | Tung |
| 6,592,019 | B2 | 7/2003 | Tung |
| 6,600,234 | B2 | 7/2003 | Kuwabara et al. |
| 6,608,388 | B2 | 8/2003 | Lin et al. |
| 6,660,560 | B2 | 12/2003 | Chaudhuri et al. |
| 6,661,084 | B1 | 12/2003 | Peterson et al. |
| 6,664,483 | B2 | 12/2003 | Chong et al. |
| 6,678,948 | B1 | 1/2004 | Benzler et al. |
| 6,681,982 | B2 | 1/2004 | Tung |
| 6,710,458 | B2 | 3/2004 | Seko |
| 6,734,557 | B2 | 5/2004 | Taniguchi et al. |
| 6,768,190 | B2 | 7/2004 | Yang et al. |
| 6,774,474 | B1 | 8/2004 | Caletka et al. |
| 6,774,497 | B1 | 8/2004 | Qi et al. |
| 6,780,673 | B2 | 8/2004 | Venkateswaran |
| 6,780,682 | B2 | 8/2004 | Pendse |
| 6,787,918 | B1 | 9/2004 | Tsai et al. |
| 6,798,072 | B2 | 9/2004 | Kajiwara et al. |
| 6,809,262 | B1 | 10/2004 | Hsu |
| 6,818,545 | B2 | 11/2004 | Lee et al. |
| 6,821,878 | B2 | 11/2004 | Danvir et al. |
| 6,849,944 | B2 | 2/2005 | Murtuza et al. |
| 6,853,076 | B2 * | 2/2005 | Datta et al. ............. 257/738 |
| 6,870,276 | B1 | 3/2005 | Moxham et al. |
| 6,888,255 | B2 | 5/2005 | Murtuza et al. |
| 6,913,948 | B2 | 7/2005 | Caletka et al. |
| 6,927,489 | B1 | 8/2005 | Yaguchi et al. |
| 6,943,058 | B2 | 9/2005 | Chaudhuri et al. |
| 7,005,585 | B2 | 2/2006 | Ishizaki |
| 7,005,743 | B2 | 2/2006 | Iwatsu et al. |

(56) References Cited

U.S. PATENT DOCUMENTS

| | | | |
|---|---|---|---|
| 7,005,750 B2 | 2/2006 | Liu | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,078,819 B2 * | 7/2006 | DiStefano | H01L 21/561 257/772 |
| 7,098,407 B2 | 8/2006 | Kim et al. | |
| 7,101,781 B2 | 9/2006 | Ho et al. | |
| 7,102,222 B2 | 9/2006 | Kuo et al. | |
| 7,102,239 B2 | 9/2006 | Pu et al. | |
| 7,112,524 B2 | 9/2006 | Hsu et al. | |
| 7,164,208 B2 | 1/2007 | Kainou et al. | |
| 7,173,828 B2 | 2/2007 | Lin et al. | |
| 7,183,493 B2 | 2/2007 | Garcia et al. | |
| 7,224,073 B2 | 5/2007 | Kim | |
| 7,242,099 B2 | 7/2007 | Lin et al. | |
| 7,271,484 B2 | 9/2007 | Reiss et al. | |
| 7,294,451 B2 | 11/2007 | Chiu et al. | |
| 7,294,457 B2 | 11/2007 | Kukolj et al. | |
| 7,294,929 B2 | 11/2007 | Miyazaki | |
| 7,317,245 B1 | 1/2008 | Lee et al. | |
| 7,361,990 B2 | 4/2008 | Lu et al. | |
| 7,405,484 B2 | 7/2008 | Usui et al. | |
| 7,436,063 B2 | 10/2008 | Miyata et al. | |
| 7,462,942 B2 | 12/2008 | Tan et al. | |
| 7,488,896 B2 | 2/2009 | Saiki et al. | |
| 7,521,284 B2 | 4/2009 | Miranda et al. | |
| 7,642,660 B2 | 1/2010 | Tay et al. | |
| 7,663,248 B2 | 2/2010 | Hedler et al. | |
| 7,663,250 B2 | 2/2010 | Jeon et al. | |
| 7,670,939 B2 | 3/2010 | Topacio et al. | |
| 7,671,454 B2 | 3/2010 | Seko | |
| 7,692,314 B2 | 4/2010 | Yang et al. | |
| 7,700,407 B2 | 4/2010 | Pendse | |
| 7,732,913 B2 | 6/2010 | Hsieh et al. | |
| 7,750,457 B2 | 7/2010 | Seko | |
| 7,790,509 B2 | 9/2010 | Gerber | |
| 7,791,211 B2 | 9/2010 | Chen et al. | |
| 7,847,399 B2 | 12/2010 | Masumoto | |
| 7,847,417 B2 | 12/2010 | Araki et al. | |
| 7,851,928 B2 | 12/2010 | Gallegos et al. | |
| 7,898,083 B2 | 3/2011 | Castro | |
| 7,902,660 B1 | 3/2011 | Lee et al. | |
| 7,902,678 B2 | 3/2011 | Ohuchi et al. | |
| 7,902,679 B2 | 3/2011 | Lin et al. | |
| 7,932,170 B1 | 4/2011 | Huemoeller et al. | |
| 7,947,602 B2 | 5/2011 | Ito et al. | |
| 7,973,406 B2 | 7/2011 | Pendse | |
| 8,026,128 B2 | 9/2011 | Pendse | |
| 8,129,841 B2 | 3/2012 | Pendse et al. | |
| 8,178,392 B2 | 5/2012 | Choi et al. | |
| 8,318,537 B2 | 11/2012 | Pendse | |
| 2001/0008309 A1 | 7/2001 | Iijima et al. | |
| 2001/0013423 A1 | 8/2001 | Dalal et al. | |
| 2002/0033412 A1 | 3/2002 | Tung | |
| 2002/0041036 A1 | 4/2002 | Smith | |
| 2002/0070451 A1 * | 6/2002 | Burnette et al. | 257/737 |
| 2002/0100610 A1 | 8/2002 | Yasuda et al. | |
| 2002/0121706 A1 | 9/2002 | Tatsuta et al. | |
| 2002/0155637 A1 | 10/2002 | Lee | |
| 2002/0179689 A1 | 12/2002 | Tung | |
| 2002/0192865 A1 | 12/2002 | Imasu et al. | |
| 2003/0049411 A1 | 3/2003 | Chaudhuri et al. | |
| 2003/0057551 A1 | 3/2003 | Datta et al. | |
| 2003/0067084 A1 | 4/2003 | Shintani | |
| 2003/0116866 A1 | 6/2003 | Cher 'Khng et al. | |
| 2003/0127734 A1 | 7/2003 | Lee et al. | |
| 2003/0127747 A1 | 7/2003 | Kajiwara et al. | |
| 2003/0157792 A1 | 8/2003 | Tong et al. | |
| 2003/0168748 A1 | 9/2003 | Katagiri et al. | |
| 2003/0175146 A1 | 9/2003 | Yeh et al. | |
| 2003/0218249 A1 * | 11/2003 | Ho | H01L 21/563 257/737 |
| 2004/0027788 A1 | 2/2004 | Chiu et al. | |
| 2004/0035909 A1 | 2/2004 | Yeh et al. | |
| 2004/0046263 A1 | 3/2004 | Harper et al. | |
| 2004/0046264 A1 | 3/2004 | Ho et al. | |
| 2004/0056341 A1 | 3/2004 | Endo et al. | |
| 2004/0105223 A1 | 6/2004 | Okada et al. | |
| 2004/0108135 A1 | 6/2004 | Ashida | |
| 2004/0126927 A1 | 7/2004 | Lin et al. | |
| 2004/0210122 A1 | 10/2004 | Sieburg | |
| 2004/0232560 A1 | 11/2004 | Su | |
| 2004/0232562 A1 | 11/2004 | Hortaleza et al. | |
| 2005/0046041 A1 | 3/2005 | Tsai | |
| 2005/0082654 A1 | 4/2005 | Humpston et al. | |
| 2005/0103516 A1 | 5/2005 | Kaneyuki | |
| 2005/0224991 A1 | 10/2005 | Yeo | |
| 2005/0248037 A1 | 11/2005 | Hung et al. | |
| 2006/0131758 A1 | 6/2006 | Dao | |
| 2006/0192294 A1 | 8/2006 | Lee | |
| 2006/0202331 A1 | 9/2006 | Hu | |
| 2006/0216860 A1 | 9/2006 | Pendse | |
| 2006/0255473 A1 | 11/2006 | Pendse | |
| 2007/0200234 A1 | 8/2007 | Gerber et al. | |
| 2007/0259514 A1 | 11/2007 | Otremba | |
| 2008/0088013 A1 | 4/2008 | Chew et al. | |
| 2008/0093749 A1 | 4/2008 | Gerber et al. | |
| 2008/0179740 A1 | 7/2008 | Liao | |
| 2008/0213941 A1 | 9/2008 | Pendse | |
| 2008/0277802 A1 | 11/2008 | Tsai et al. | |
| 2009/0045507 A1 | 2/2009 | Pendse et al. | |
| 2009/0057378 A1 | 3/2009 | Hwang et al. | |
| 2009/0108445 A1 | 4/2009 | Liang | |
| 2009/0114436 A1 | 5/2009 | Chen et al. | |
| 2009/0146303 A1 | 6/2009 | Kwon | |
| 2009/0152716 A1 | 6/2009 | Sohara | |
| 2009/0191329 A1 | 7/2009 | Wang | |
| 2009/0288866 A1 | 11/2009 | Tsai et al. | |
| 2009/0308647 A1 | 12/2009 | Liao | |
| 2010/0139965 A1 | 6/2010 | Wang et al. | |
| 2011/0049703 A1 | 3/2011 | Hsu et al. | |
| 2013/0214409 A1 | 8/2013 | Pagaila et al. | |
| 2013/0277830 A1 | 10/2013 | Yu et al. | |

FOREIGN PATENT DOCUMENTS

| | | |
|---|---|---|
| JP | 6503687 | 4/1994 |
| JP | 09-097791 | 8/1997 |
| JP | 10-256307 | 9/1998 |
| JP | 10-256315 | 9/1998 |
| JP | 11145176 | 5/1999 |
| JP | 11233571 | 8/1999 |
| JP | 11330162 | 11/1999 |
| JP | 2000-031204 | 1/2000 |
| JP | 2000-133667 | 12/2000 |
| JP | 2000-349194 | 12/2000 |
| JP | 2001156203 | 6/2001 |
| JP | 2001-332583 | 11/2001 |
| JP | 2001351945 | 12/2001 |
| JP | 2002270732 | 9/2002 |
| JP | 2004-221205 | 5/2004 |
| JP | 2004165283 | 6/2004 |
| JP | 2005109187 | 4/2005 |
| JP | 2005333166 | 12/2005 |
| KR | 199879438 | 10/1997 |
| KR | 200062333 | 6/1999 |
| SG | 100817 | 7/2004 |
| TW | 530398 B | 5/2003 |
| WO | 9306964 | 4/1993 |
| WO | 0013228 | 3/2000 |
| WO | 03071842 | 8/2001 |

OTHER PUBLICATIONS

Gerber et al., "Next Generation Fine Pitch Cu Pillar Technology—Enabling Next Generation Silicon Nodes", Electronic Components and Technology Conference, pp. 612-618, 2011.

He et al., "All-Copper Chip-to-Substrate Interconnects Part II. Modeling and Design", Journal of the Electrochemical Society, 155(4):D314-D322, 2008.

Heinen, K. Gail et al., "Multichip Assembly with Flipped Integrated Circuits", IEEE Transactions on Components, Hybrids, and Manufactureing Technology, vol. 12 No. 4, 1989, pp. 650-657.

(56) References Cited

OTHER PUBLICATIONS

Kawahara, Toshimi, "SuperCSP", IEEE Transactions on Advanced Packaging, May 2000, pp. 215-219, vol. 23, No. 2.

Lau, John H. et al., "A New Thermal-Fatigue Life Prediction Model for Wafer Level Chip Scale Package (WLCSP) Solder Joints", Journal of Electronic Packaging, vol. 124, 2002, pp. 212-220.

Love, David et al., "Wire Interconnect Technology, A New High-Reliability Tight-Pitch Interconnect Technology", Karl Suss, 1999.

Lu, H. et al., "Predicting Optimal Process Conditions for Flip-Chip Assembly Using Copper Column Bumped Dies", Electronics Packaging Technology Conference, 2002, pp. 338-343.

Pendse et al., "Bon-on-Lead: A Novel Flip Chip Interconnection Technology for Fine Effective Pitch and High I/O Density", Electronic Components and Technology Conference, pp. 16-23, 2006.

Powell, D. O. et al., Flip-Chip on FR-4 Integrated Circuit Packaging, HBN Technology Products, 1993, pp. 182-186.

Schubert, A. et al.. "Numerical and Experimental Investigations of Large IC Flip Chip Attach", Electronic Components and Technology Conference, 2000, pp. 1338-1346.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Yamada, Hiroshi et al., "Advanced copper column based solder bump for flip-chip interconnection", International Symposium on Microelectronics, 1997, pp. 417-422, The British Library—"The world's knowledge".

\* cited by examiner

SOLDER JOINT FLIP CHIP INTERCONNECTION

CLAIM TO DOMESTIC PRIORITY

The present application is a continuation of U.S. patent application Ser. No. 13/367,214, now U.S. Pat. No. 8,810,029, filed Feb. 6, 2012, which is a continuation of U.S. patent application Ser. No. 12/624,482, now U.S. Pat. No. 8,129,841, reissued as U.S. Pat. No. RE44,608, filed Nov. 24, 2009, which is a continuation of U.S. patent application Ser. No. 11/640,468, now abandoned, filed Dec. 14, 2006, which claims the benefit of U.S. Provisional Application No. 60/597,648, filed Dec. 14, 2005, and further is a continuation-in-part of U.S. patent application Ser. No. 11/388,755, now abandoned, filed Mar. 24, 2006, which claims the benefit of U.S. Provisional Application No. 60/665,208, filed Mar. 25, 2005, and further is a continuation-in-part of U.S. patent application Ser. No. 10/985,654, now U.S. Pat. No. 7,368,817, filed Nov. 10, 2004, which claims the benefit of U.S. Provisional Application No. 60/518,864, filed Nov. 10, 2003 and U.S. Provisional Application No. 60/533,918, filed Dec. 31, 2003. All of the above applications are incorporated herein by reference.

FIELD OF THE INVENTION

This invention relates to semiconductor packaging and, particularly, to flip chip interconnection.

BACKGROUND OF THE INVENTION

This invention relates to semiconductor packaging and, particularly, to flip chip interconnection.

Flip chip packages include a semiconductor die mounted onto a package substrate with the active side of the die facing the substrate. The substrate is made up of a dielectric layer and at least one metal layer, patterned to provide substrate circuitry, which includes among other features traces ("leads") leading to interconnect pads. The metal layer may be patterned by, for example, a mask- and etch process. Conventionally, interconnection of the circuitry in the die with circuitry in the substrate is made by way of bumps which are attached to an array of interconnect pads on the die, and bonded to a corresponding (complementary) array of interconnect pads (often referred to as "capture pads") on the substrate. The capture pads are typically much wider than the leads, and can be as wide as, for example, about 2 to 4 times the nominal or design width of the leads. Conventionally, the interconnect area on the capture pad is approximately equal to the interconnect area on the die pad.

The areal density of electronic features on integrated circuits has increased enormously, and chips having a greater density of circuit features also may have a greater density of sites ("die pads") for interconnection with the circuitry on a package substrate.

The package is connected to underlying circuitry, such as a printed circuit board (e.g., a "motherboard"), in the device in which the package is employed, by way of second level interconnects (e.g., pins, secondary interconnect solder balls) between the package and the underlying circuit. The second level interconnects have a greater pitch than the flip chip interconnects, and so the routing on the substrate conventionally "fans out". Significant technological advances in patterning the metal layer on the substrate have enabled construction of fine lines and spaces; but in the conventional arrangement space between adjacent pads limits the number of traces than can escape from the more inward capture pads in the array, and the fan out routing between the capture pads beneath the die and the external pins of the package is conventionally formed on multiple metal layers within the package substrate. For a complex interconnect array, substrates having multiple layers may be required to achieve routing between the die pads and the second level interconnects on the package.

Multiple layer substrates are expensive, and in conventional flip chip constructs the substrate alone typically accounts for more than half the package cost (about 60% in some typical instances). The high cost of multilayer substrates has been a factor in limiting proliferation of flip chip technology in mainstream products.

In conventional flip chip constructs the escape routing pattern typically introduces additional electrical parasitics, because the routing includes short runs of unshielded wiring and vias between wiring layers in the signal transmission path. Electrical parasitics can significantly limit package performance.

Flip chip interconnection is commonly used in a wide variety of integrated circuit designs, including for example ASIC, GPU, Chipset, DSP, FPGA.

SUMMARY OF THE INVENTION

The aforementioned challenges presented by conventional flip chip interconnect can be addressed by connecting the interconnect bump directly onto a lead ("Bump-on-Lead" interconnect, or "BoL"); or by connecting the interconnect bump directly onto a narrow interconnection pad, or narrow pad ("Bump-on-Narrow Pad", or "BoNP") rather than onto a conventional capture pad. Such approaches are described in, for example, related U.S. application Ser. No. 10/985,654 (BoL) and U.S. application Ser. No. 11/388,755 (BoNP), referenced above.

BoNP or BoL approaches can provide more efficient routing of traces on the substrate. Particularly, the signal routing can be formed entirely in a single metal layer of the substrate. This can reduce the number of layers in the substrate, and forming the signal traces in a single layer also permits relaxation of some of the via, line and space design rules that the substrate must meet. This simplification of the substrate greatly reduces the overall cost of the flip chip package. The bump-on-lead architecture also helps eliminate such features as vias and "stubs" from the substrate design, and enables a microstrip controlled impedance electrical environment for signal transmission, thereby greatly improving performance.

We have discovered that, within selected design parameters, a BoL or BoNP flip chip interconnection can be at least as reliable as a conventional bond on capture pad interconnect. Generally, within a range, interconnect structures formed on narrower leads—that is, more sharply tapered interconnect structures—can be more reliable than interconnect structures formed on less narrow leads.

Particularly, where the CTE of the die differs significantly from the CTE of the substrate, improved reliability can result from configuring the interconnect so that the interconnect structure is tapered, and the area of contact of the solder with the site on the lead is significantly less than the area of contact of the solder with the die pad. The contact at the site on the lead can be narrower as a result of a narrow dimension of the lead at the site (BoL) or of a narrow pad at the site (BoNP); or the contact at the site on the lead can be narrow as a consequence of masking a larger pad or otherwise limiting the solder-wettable area of a larger pad.

In some embodiments, the CTE of the substrate is significantly greater than the CTE of the die; and the material of the interconnect structure is selected to be close to that of the substrate. For example, the CTE of a laminate (organic) substrate is typically in a range about 16-18 ppm/degree C.; the CTE of silicon is about 2-3 ppm/degree C.; the CTE of "glass ceramic" (in earlier use for substrates) is about 3-4 ppm/degree C.; the CTE of a co-fired ceramic (in use in multilayer substrates—as any as 16-18 layers, for example) is about 8-8.5 ppm/degree C. The CTE of a laminate (organic) substrate, on the other hand, is typically in a range about 16-18 ppm/degree C., and so a significant CTE mismatch exists between silicon die and organic laminate or build-up substrates. In some embodiments, the die is silicon-based, the substrate is an organic laminate or build-up substrate, and the tapered interconnect structure has a CTE in the range about 18-28 ppm/degree C.

In one general aspect, the invention features a flip chip interconnection having tapered interconnect structures, in which a width of the connection of the interconnect structure with a die pad is greater than a width of the connection of the interconnect structure with a site on a lead. In some embodiments, the connection at the die pad is about 1.5 times as wide as the connection at the lead, or is about 2 times as wide as the connection at the lead, or is about 3 times as wide as the connection at the lead, or is about 4 times as wide as the connection at the lead. The width of the connection at the die pad can be in a range about 50 μm to about 150 μm; die pads in common use have widths about 110 (or 120) μm and about 90 μm. The width of the connection at the site at the lead can be in a range about 20 μm to about 100 μm; some standard leads have widths at the site about 50 μm, or about 40 μm, or about 30 μm. Where the CTE mismatch between the die and the substrate is greater, a more sharply tapering interconnect structure may prove more reliable; where the CTE mismatch is less, a less sharply tapered interconnect structure may prove suitable.

In some embodiments, the interconnect structure is a composite structure, including a higher-melting bump connected to the die pad, and a lower-melting solder connecting the bump to the site on the lead. The lower-melting component of the composite structure can be provided as a cap on the bump; or, the lower-melting component can be provided on the interconnect site (for example as a solder paste, or a plated spot); or a lower-melting material could be provided on each the bump and the site. The higher-melting bump can be of a material that is substantially non-collapsible at the reflow temperatures employed in making the interconnect. In such embodiments the higher-melting bump can be, for example, a high-lead solder (such as a lead-tin alloy having high lead content), or copper, or gold, or nickel, or a combination of these. The lower-melting solder can be, for example, a eutectic solder, which may be tin-based, including tin and alloys of tin such as silver, copper, or lead, or a combination of these. Or, the bump could be entirely of a material that melts at the reflow temperature.

The bump can be affixed to the die pad; or, it can be formed on the die pad in situ by printing or plating the bump material at the die pads and then heating to form the bumps.

In another general aspect, the invention features a flip chip package including a die having interconnect pads in an active surface, and a substrate having interconnect sites on electrically conductive traces in a die attach surface, in which tapered interconnect structures connect the die pads to the sites. In some embodiments, the sites include locations in the leads (BoL); in some embodiments the sites include narrow pads in the leads (BoNP); in some embodiments the sites include small-area portions of capture pads.

The bump-on-lead interconnection is formed according to methods of the invention either with or without use of a solder mask to confine the molten solder during a re-melt stage in the process. Avoiding the need for a solder mask can allow for finer interconnection geometry.

In some embodiments, the substrate is further provided with a solder mask having openings over the interconnect sites on the leads. In some embodiments, the substrate is further provided with solder paste on the leads at the interconnect sites.

We have also found by computer modeling that thermally-induced maximum stress in BoL interconnections is less on leads that are oriented at the interconnect site toward a thermally neutral point on the die (that is, in a "radial" direction) than on leads that are oriented at the interconnect site perpendicularly to a radial direction.

In another general aspect, the invention features a substrate for BoL or BoNP flip chip interconnection, in which the lengthwise dimension of the interconnect site (the mating portion of the lead or narrow pad) is oriented in a direction approximately aligned toward the thermally neutral point of the die, or deviating less than about 45° (more usually, less than about 20°; still more usually, less than about 10°) from such an alignment.

In another general aspect, the invention features a method for forming flip chip interconnection, by providing a substrate having interconnect sites in conductive traces formed in a die attach surface, providing a die having bumps attached to interconnect pads in an active surface; providing a fusible conductive material on the bumps or on the interconnect sites (or on each the bumps and the interconnect sites); supporting the substrate and the die; positioning the die with the active side of the die toward the die attach surface of the substrate, and aligning the die and substrate and moving one toward the other so that the bumps contact the corresponding sites; and melting and then re-solidifying the fusible material, forming a metallurgical interconnection between the bump and the trace. In some embodiments, the method further includes forming an underfill between the die and the substrate.

In another general aspect, the invention features a method for forming flip chip interconnection, by providing a substrate having traces formed in a die attach surface and having a solder mask having openings over interconnect sites on the leads, and a die having bumps attached to interconnect pads in an active surface; supporting the substrate and the die; positioning the die with the active side of the die toward the die attach surface of the substrate, and aligning the die and substrate and moving one toward the other so that the bumps contact the corresponding traces (leads) on the substrate; melting and then re-solidifying to form the interconnection between the bump and the interconnect site on the trace.

In some embodiments, the solder bump includes a collapsible solder portion, and the melt and solidifying step melts the bump to form the interconnection on the interconnect site. In some embodiments, the substrate is further provided with a solder paste on the interconnect site, and the step of moving the die and the substrate toward one another effects a contact between the bump and the solder on the site, and the melt and solidifying step melts the solder on the site to form the interconnection.

In another general aspect, the invention features a method for forming flip chip interconnection, by providing a substrate having traces formed in a die attach surface and having a solder mask having openings over interconnect sites on the leads and having solder paste on the leads at the interconnect sites, and a die having bumps attached to interconnect pads in an active surface; supporting the substrate and the die; positioning the die with the active side of the die toward the die attach surface of the substrate, and aligning the die and substrate and moving one toward the other so that the bumps contact the solder paste on the corresponding traces (leads) on the substrate; and melting and then re-solidifying the solder paste, forming a metallurgical interconnection between the bump and the trace.

In another general aspect, the invention features a flip chip package, including interconnections formed as described above, and additionally including forming an underfill between the die and the substrate.

DETAILED DESCRIPTION OF THE DRAWINGS

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

The conventional flip chip interconnection is made by using a melting process to join the bumps (conventionally, solder bumps) onto the mating surfaces of the corresponding capture pads and, accordingly, this is known as a "bump-on-capture pad" ("BoC") interconnect. Two features are evident in the BOC design: first, a comparatively large capture pad is required to mate with the bump on the die; second, an insulating material, typically known as a "solder mask" is required to confine the flow of solder during the interconnection process. The solder mask opening may define the contour of the melted solder at the capture pad ("solder mask defined"), or the solder contour may not be defined by the mask opening ("non-solder mask defined").

The techniques for defining solder mask openings have wide tolerance ranges. Consequently, for a solder mask defined bump configuration, the capture pad must be large (typically considerably larger than the design size for the mask opening), to ensure that the mask opening will be located on the mating surface of the pad; and for a non-solder mask defined bump configuration, the solder mask opening must be larger than the capture pad. The width of capture pads (or diameter, for circular pads) is typically about the same as the ball (or bump) diameter, and can be as much as two to four times wider than the trace width. This results in considerable loss of routing space on the top substrate layer. In particular, for example, the "escape routing pitch" is much bigger than the finest trace pitch that the substrate technology can offer. This means that a significant number of pads must be routed on lower substrate layers by means of short stubs and vias, often beneath the footprint of the die, emanating from the pads in question.

Figure 1A:
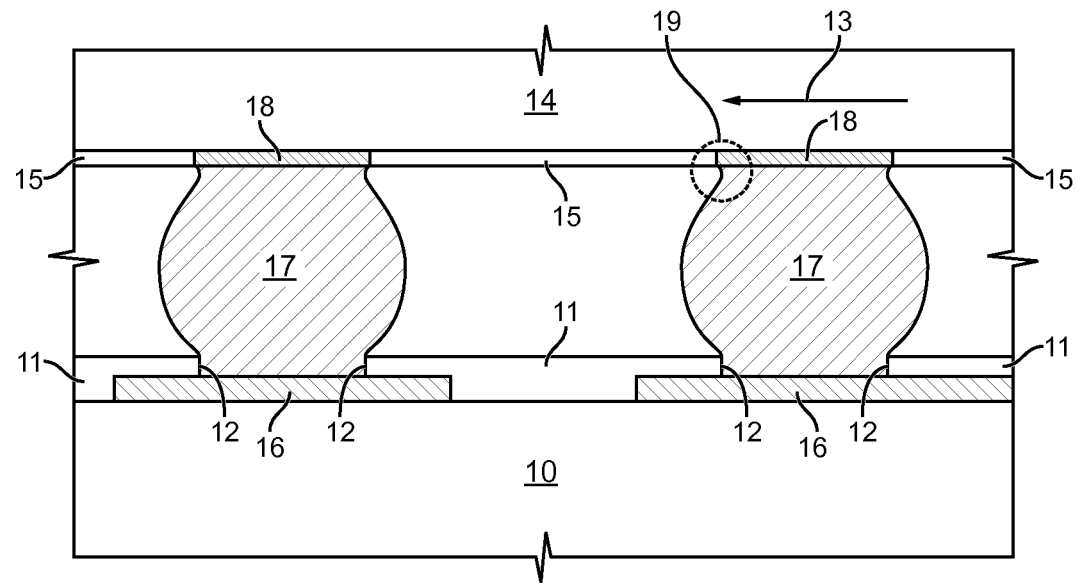
FIG. 1A is a diagrammatic sketch of a portion of a conventional bump-on-capture pad ("BoC") flip chip interconnection, in a sectional view parallel to the plane of the package substrate surface.

FIG. 1A shows a portion of a conventional flip chip package, in diagrammatic sectional view; the partial sectional view in FIG. 1A is taken in a plane perpendicular to the package substrate surface. Referring now to FIG. 1A, a die attach surface of the package substrate includes a patterned electrically conductive layer formed on a dielectric layer 10. The metal layer is patterned to form leads and capture pads 16. An insulating layer 11, typically termed a "solder mask", covers the die attach surface of the substrate; the solder mask is usually constructed of a photodefinable material, and is patterned by conventional photoresist patterning techniques to have openings, indicated at 12, leaving the mating surfaces of the capture pads 16 exposed. Interconnect bumps 17 attached to pads (so-called "under bump metallization") 18 on the active side of the die 14 are joined to the mating surfaces of corresponding capture pads 16 on the substrate to form appropriate electrical interconnection between the circuitry on the die and the leads on the substrate. The active side of the die 14 is covered, except at the contact surfaces of the die pads 16, with a die passivation layer 15, which may be, for example, a polyimide layer. After the reflowed solder is cooled to establish the electrical connection, an underfill material (not shown in these FIGs.) is introduced into the space between the die and the substrate, mechanically stabilizing the interconnects and protecting the features between the die and the substrate.

In such a conventional flip chip interconnect arrangement, signal escape traces in the upper metal layer of the substrate lead from their respective capture pads across the die edge location, and away from the die footprint. The capture pads are typically three times greater than the trace width. In one example of a conventional arrangement, the capture pads are arranged in a 210 μm two-row area array pitch in a solder mask defined configuration, with one signal trace between capture pads in the marginal row, resulting in an effective escape pitch about 105 μm, for example. In one example of a BoL interconnect, the interconnect sites can be arranged in a 210 μm three-row area array pitch, with two signal traces between sites in the outer row, resulting in an effective escape pitch about 70 μm. This escape pitch is adequate to route a significant proportion of integrated circuit designs that commonly employ flip chip interconnection on a single metallization layer, based on the inherent I/O density of the IC device architectures. BoL interconnection also further opens the prospect of routing a considerable proportion of flip chip designs in conventional through-hole laminate substrates, inasmuch as laminate substrates have line/space capacities of about 40 μm/40 μm (or better). This could provide for substantial cost reduction.

FIG. 1A shows a solder mask defined solder contour. As the fusible material of the bumps on the die melts, the molten solder tends to "wet" the metal of the capture pads, and the solder tends to "run out" over any contiguous metal surfaces that are not masked. The solder tends to flow along the underlying pad (and exposed contiguous lead), and in the solder mask defined contour the solder flow is limited by the solder mask, for example by the width of the opening 12 in the solder mask 11.

A non-solder mask defined solder contour may alternatively be employed, in which the flow of solder along the lead is limited at least in part by a patterned deposition of non-solder-wettable material on the lead surface.

Figure 1B:
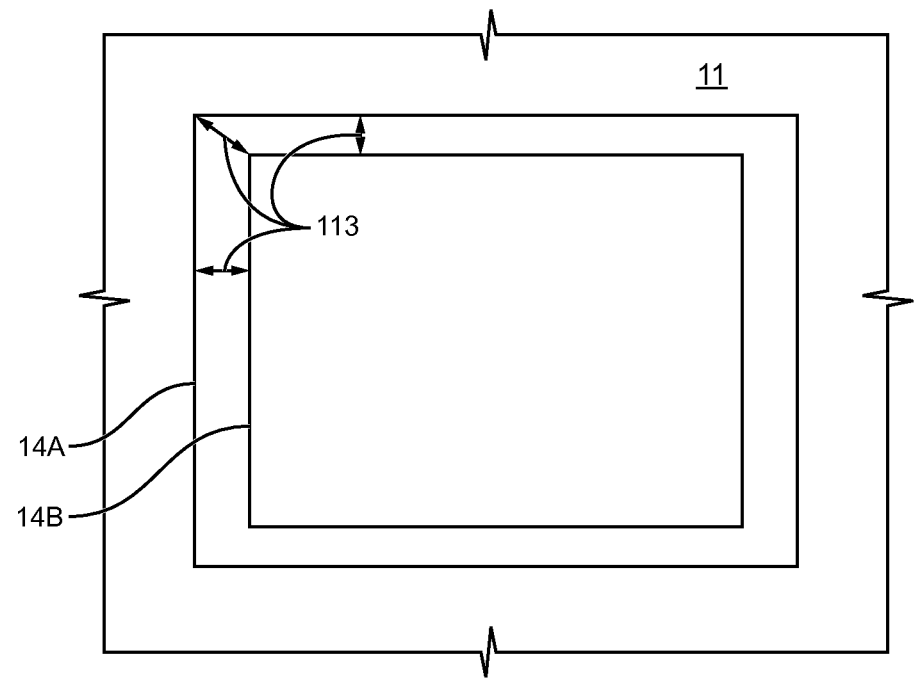
FIG. 1B is a diagrammatic sketch in a plan view showing a die mounted on a substrate in a flip chip manner, in which the die and the substrate have significantly different thermal expansion coefficients, and showing dimensional change of the die in relation to the substrate as a result of change in temperature.

Thermal movement (in the x-y plane) of die pads on the die attach surface of the die in relation to the corresponding points on the substrate (as indicated for example by arrow 13 in FIG. 1A), can result in stresses to the interconnections between the die pad and the site on the substrate. Dimensional change, resulting from temperature changes, of a flip chip mounted die in relation to a substrate, is shown diagrammatically (and with dimensions exaggerated) in plan view in FIG. 1B. In this example, there is a significant mismatch between the CTE of the die and the CTE of the substrate. A portion of the substrate is shown at 11. Dimensional change of the die in the x-y plane (parallel to the plane of the substrate) in relation to the substrate as the temperature changes (for example, during thermal cycling in assembly or test or die burnout routines) is shown by the arrows 113. A footprint of the die at a higher temperature (the substrate is more "thermally expanded" than the die) is shown at 14B; a footprint of the die at a lower temperature is shown at 14B. As will be appreciated, registration of any point on the active surface of the die 14 with respect to a corresponding underlying point on the die attach surface of the substrate 11 will change as the dimensions of the die and substrate change differentially as a result of thermal stress. At some point on the active surface of the die there is no net movement with relation to the corresponding point on the underlying substrate, as a result of expansion or contraction of the die in relation to the substrate; that point may be referred to herein as the "thermally neutral point". Generally, as may be appreciated, the thermally neutral point may approximately coincide with the geometric center of the die surface. The extent of movement of any point on the die in an x-y plane (parallel to the plane of the substrate) in relation to the substrate as a result of thermal expansion or contraction (the "thermal movement") depends at least in part upon the distance of that point from the thermally neutral point on the die; accordingly, there is greater relative thermal movement at points nearer the edges of the die (and, particularly, near the corners of the die) than at points nearer the thermally neutral point.

Movement (in the x-y plane) of a die pad in relation to an underlying contact pad can result in stresses to the interconnection between the pad and the contact pad. Where the movement passes a limit, something has to give: failure of the interconnect can result. In conventional flip chip interconnects, where there is a thermal mismatch between the die and the substrate, failure typically occurs at the joint between the solder bump and the die pad. And, in conventional flip chip interconnects, where there is a thermal mismatch between the die and the substrate, even if there is no failure, thermal stress at the die pad can cause damage to the die.

Conventionally it is thought that, in an ideal solder joint structure, the area (diameter) of the interconnect pad on the substrate is approximately equal to the area (diameter) of the interconnect pad on the die, as shown by way of example in FIG. 1A.

By analysis of interconnect configurations using computer simulations, we have determined that the primary locus of stress is as referenced at 19 in FIG. 1A. Particularly, where the thermal movement of the die in relation to the substrate is as shown at arrow 13 in FIG. 1A, the greatest ("Maximum") plastic strain on the interconnect is predicted by the computer model to be at the "leading edge" 19 of the connection (interface) between the solder 17 and the die pad (UBM) 18. (As will be appreciated, the arrow might be positioned at the substrate, but reversed, showing relative movement of the substrate in the opposite direction; the relative movement is pointed out here in relation to the die, because the thermally neutral point is established in relation to the die footprint. The appearance of actual failures during accelerated fatigue testing is consistent with the model; that is, failure in conventional bond-on-capture pad interconnects usually appears at the interface of the solder with the die pad, rather than at the interface of the solder with the capture pad on the substrate.

Figure 2A:
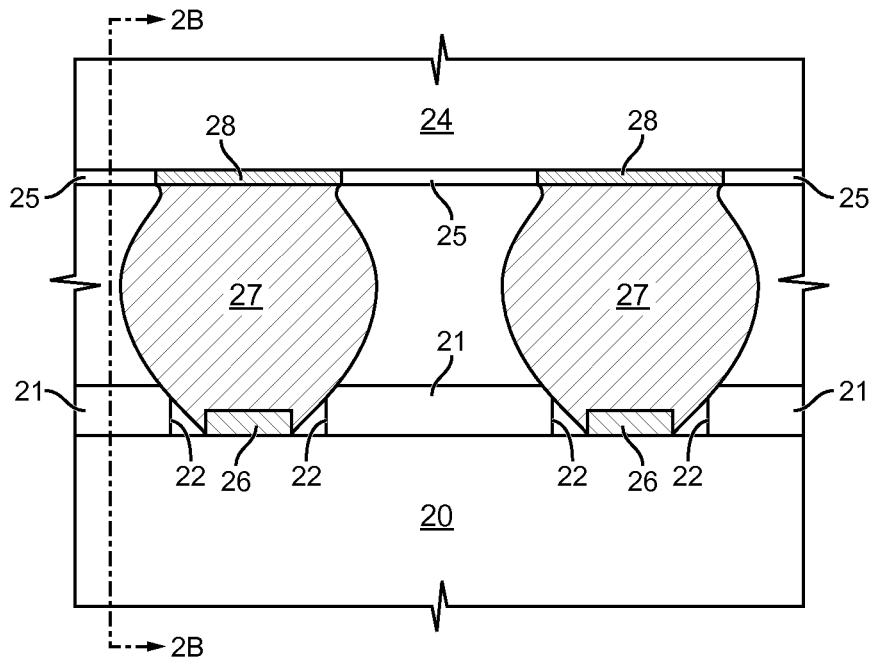
FIG. 2A is a diagrammatic sketch showing a portion of a flip chip interconnection according to the invention, in a sectional view perpendicular to the plane of the package substrate surface and generally transverse to the long axes of the leads.
Figure 2B:
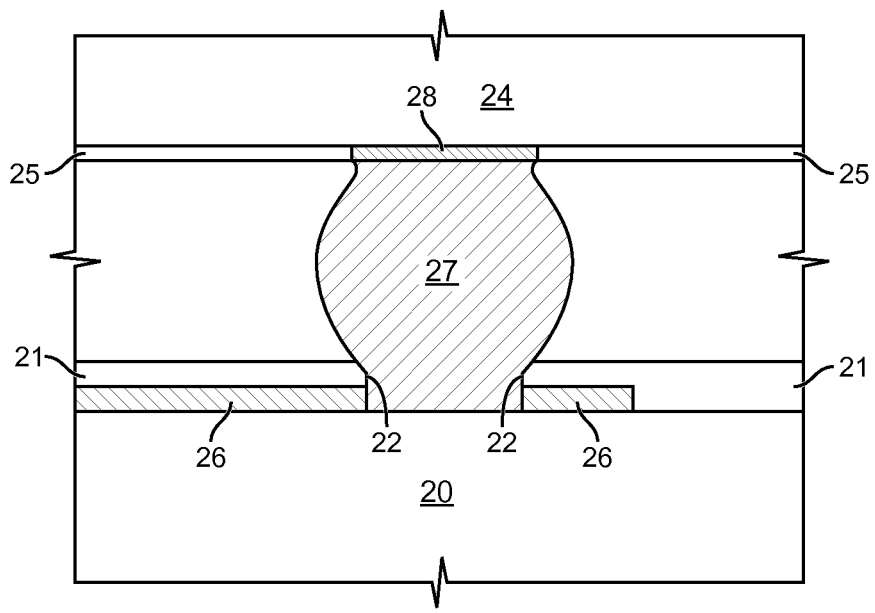
FIG. 2B is a diagrammatic sketch showing a portion of a flip chip interconnection according to the invention, in a sectional view perpendicular to the plane of the package substrate surface and generally parallel to the long axes of the lead.

A BoL interconnection according to an embodiment of the invention is shown by way of example in sectional views perpendicular to the surface of the substrate in FIGS. 2A and 2B. In FIG. 2A, two solder joints are shown in a sectional view transverse to the lead, and in FIG. 2B, one solder joint is shown in a sectional view parallel to the lead. Referring to FIG. 2A, a die attach surface of the package substrate includes a patterned electrically conductive layer formed on a dielectric layer 20. The metal layer is patterned to form leads having interconnect sites 26. An insulating layer 21, typically termed a "solder mask", covers the die attach surface of the substrate; the solder mask is usually constructed of a photodefinable material, and is patterned by conventional photoresist patterning techniques to have openings, indicated at 22, leaving the top surface and the sides of the lead (the "mating surfaces") exposed at the interconnect site 26. Interconnect structures 27 are attached to pads (so-called "under bump metallization") 28 on the active side of the die 24 and are joined to the mating surfaces of the leads at the interconnect sites 26 on the substrate to form appropriate electrical interconnection between the circuitry on the die and the leads on the substrate. The active side of the die 24 is covered, except at the contact surfaces of the die pads 28, with a die passivation layer (such as a polyimide layer) 25. After the reflowed solder is cooled to establish the electrical connection, an underfill material (not shown in these FIGs.) is introduced into the space between the die and the substrate, mechanically stabilizing the interconnects and protecting the features between the die and the substrate.

Referring now to FIG. 2B, an interconnect is shown in a sectional view taken along the line 2B-2B in FIG. 2A. (In this view, the solder mask 21 is not shown.) This view shows the solder of interconnect structure 27 covering the sides of the lead 26.

The interconnect structures according to some embodiments can be made using entirely fusible materials, or using composite bumps, or using a solder-on-lead method, as described above.

Particularly, for example, so-called composite interconnect structures may be used. Composite structures have at least two bump portions, made of different materials, including one which is collapsible under reflow conditions, and one which is substantially non-collapsible under reflow conditions. The non-collapsible portion is attached to the interconnect pad on the die; typical conventional materials for the non-collapsible portion include various solders having a high lead (Pb) content, for example, (such as a lead-tin alloy having high lead content), or copper, or gold, or nickel, or a combination of these. The collapsible portion is joined to the non-collapsible portion, and it is the collapsible portion that makes the connection with the interconnect site on the lead.

Typical conventional materials for the collapsible portion of the composite bump include eutectic solders, for example, which may be tin-based, including tin and alloys of tin such as silver, copper, or lead, or a combination of these.

This structure can be formed in the following way, for example. Solder bumps (or balls) are attached to or formed on the die pads (under bump metallization or UBM). Solder is applied to the interconnect sites on the traces, for example in the form of a solder paste. The die is oriented, active side facing the mounting surface of the substrate, so that the bumps on the die are aligned with the respective interconnect sites on the leads, and the die is moved toward the substrate to bring the bumps into contact with the solder on the leads. The assembly is then heated, to reflow the solder and form the connection at the interconnect site. As the solder on the lead reflows, it wicks to the solder-wettable surface of the solder bump, and to the solder-wettable mating surfaces of the lead. The surface of the substrate dielectric 20 is not solder-wettable, and the solder tends to make little or no contact with the substrate dielectric. The tapered form of the connection structure (as viewed in section across the lead, as in FIG. 2A) results from the narrow dimension of the lead at the interconnect site, and the wicking of the solder during reflow.

For example, the bumps may be formed of a high-lead (high-Pb) solder (e.g., 97% lead, 2% tin), and the solder on the interconnect site can be a eutectic solder. Reflow in some such examples can be carried out at a peak temperature of 235° C., employing flux in a jet flux method.

In a BoL construct such as is shown here, although the width of the leads may vary over their length, no particular widening of the leads is formed at the interconnect sites; in a BoNP construct, the leads may be widened to a limited extent at the interconnect sites. In either BoL or BoNP construct, the sides of the lead—as well as the top—(the mating surfaces) are exposed to the solder at the interconnect site, and during reflow solder wicks to the solder-wettable surfaces.

As noted with reference to FIG. 2B, a solder mask is employed in these embodiments to limit the flow of solder along the length of the leads. In other embodiments the leads may be treated to be non-solder-wettable along portions of the leads adjacent the mating surfaces at the interconnect sites, so that flow of solder away from the interconnect sites along the leads is limited without use of a solder mask.

Any of a variety of substrate types can be employed according to the invention, including for example build-up film substrates and laminate substrates. For example, a 1-2-1 high-density build-up substrate can be used (such as an Ajinomoto Build-Up Film, or other high density substrate build-up film), or a 4-layer laminate substrate can be used.

Testing of samples constructed generally as shown in FIGS. 2A and 2B and employing a high-lead solder ball and a eutectic solder on the interconnect site shows that eventual failure can occur at or near the lead, rather than at the die pad, as in the conventional interconnect. Moreover, in embodiments according to the invention, where the difference between the areas of contact at the die pad and at the lead is sufficiently great, a greater number of thermal cycles to failure can be obtained.

Figure 3A:
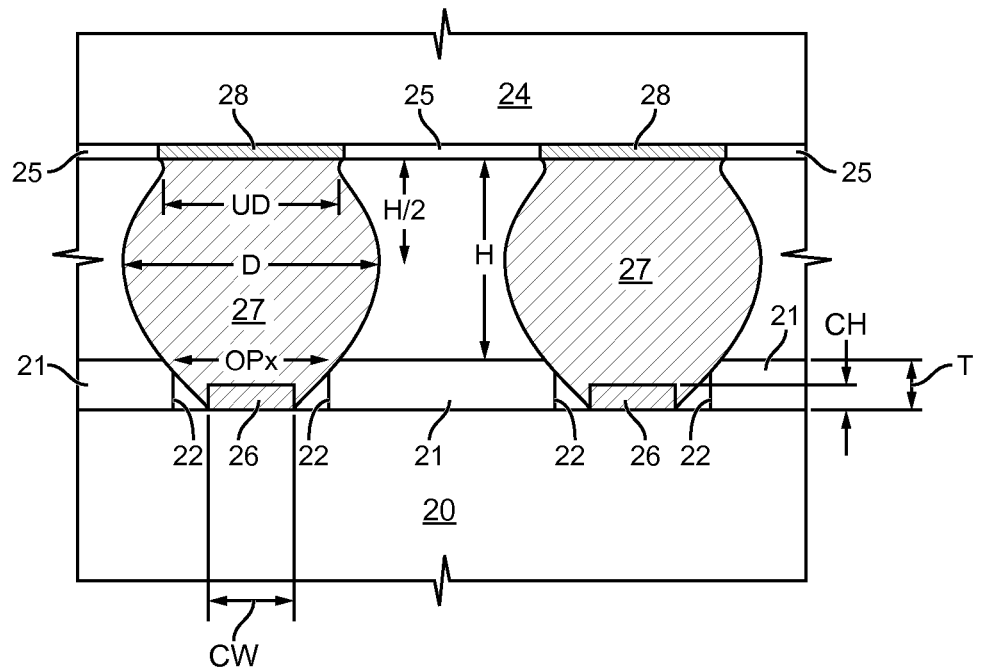
FIGS. 3A and 3B are diagrammatic sketches as in FIGS. 2A and 2B, respectively indicating dimensional references for various of the features.
Figure 3B:
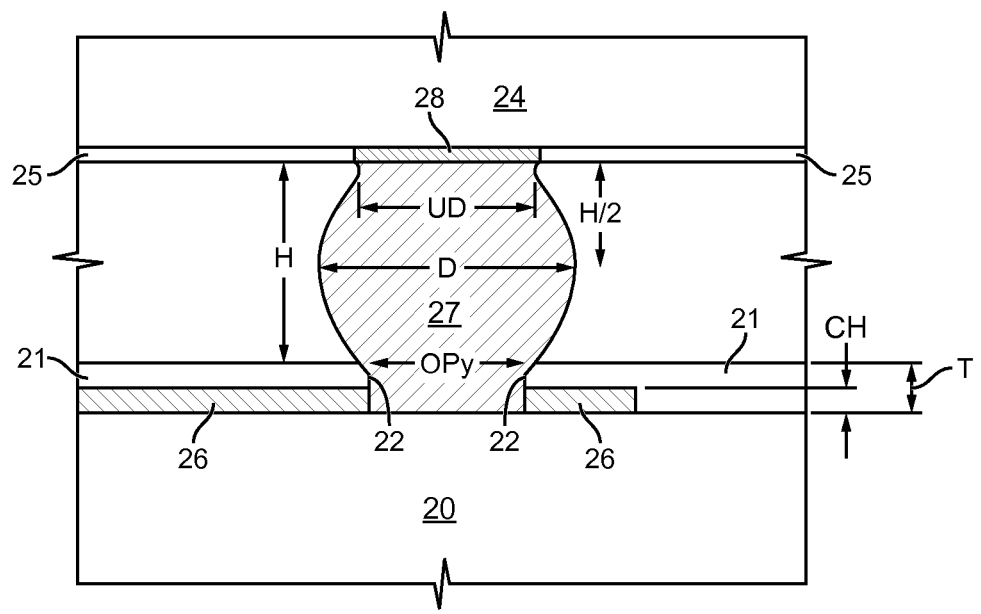

FIGS. 3A and 3B are similar to FIGS. 2A and 2B, marked up for reference to dimensions of certain of the features. The features are referenced as follows: H, interconnect height as measured from the die surface to the solder mask surface; D, bump diameter at half the interconnect height (H/2); UD, under bump metallization diameter; OPx, mask opening width in the x-direction (across the lead); OPy, mask opening width in the y-direction (along the lead); CW, width of the (Copper) lead at the interconnect site; CH, thickness (height) of the lead at the interconnect site; T, solder mask thickness.

A BoL construct according to the invention may have the following dimensions, for example: UD, 90 µm; D, 0.110 µm; H, 75 µm; T, 40 µm; CW, 30 µm, CT, 20 µm. A BoL construct having these dimensions formed on an Ajinomoto Build-Up Film (ABF) 1-2-1 substrate has performed well in fatigue failure tests. This result is surprising, because it is conventionally believed that preferred interconnects should have a shape and support area for the joint at the die side approximately equal to that on the substrate side (bond-on-capture pad, or BoC). (A similar BoL construct, having a wider CW (40 µm) and formed on a 4-layer BT laminate, performed less satisfactorily.) Without intending to be bound thereto, the applicants suggest that the following hypothesis might explain this surprising result. Although in the conventional BoC the average strain on the interconnect system is determined by the magnitude of the CTE mismatch between the die and the substrate, a high strain concentration occurs at the bump/die interface, because at this location there is an abrupt difference in CTE. Accordingly, applicants suggest that fatigue failure is driven by a concentration of plastic strain at this location, and not by the average strain. In the BoL construct, because the interconnect structure is tapered, the portion of it nearer the substrate has a greater compliancy; particularly, applicants suggest that there is a high compliancy region (or "relief structure") at or near the narrow interface at the interconnect site on the trace. Applicants suggest that this relief structure has an effect of diffusing the strain away from the die pad, resulting in improved fatigue life of the system. A computer analysis (Finite Element Modeling, FET) can lend support to this view.

A conventional (BoC) construct having the following dimensions was used for the FET analysis: UD, 90 µm; D, 0.110 µm; H, 75 µm; OPx, 95 µm; T, 40 µm; CW, 115 µm, CT, 20 µm. The analysis showed a considerable concentration of maximum strain at the interface with the die pad in the BoC model, and a maximum plastic strain in a zone on the "leading edge" of the structure at the die pad (see, FIG. 1A). In the BoL model, the maximum plastic strain is reduced, and it is shifted away from the die pad interface.

Figure 4:
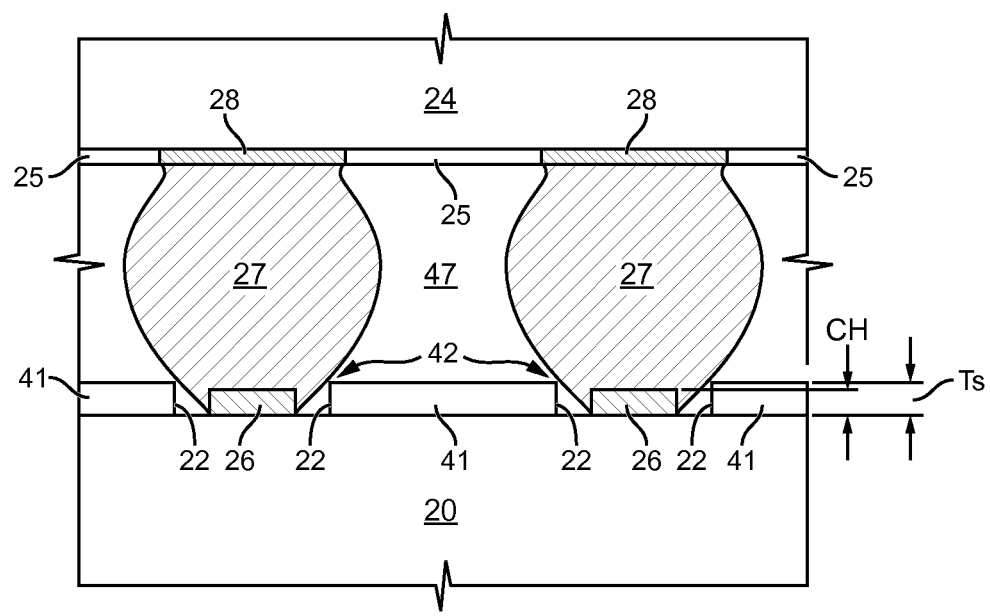
FIG. 4 is a diagrammatic sketch in a sectional view of an embodiment of the invention, showing an underfill.

A flip chip package according to the invention includes an underfill, between the substrate 20 and the die 24, as shown in one embodiment at 47 in FIG. 4. As will be appreciated by inspection of FIG. 2A, for example, the contact of the interconnect structure 27 with the solder mask can prevent flow of the underfill material into the region in the solder mask opening immediately adjacent the interconnection structure with the site on the trace. In some practical applications, the existence of voids can be undesired and, accordingly, it may be preferred to reduce the thickness of the solder mask, as shown at Ts in FIG. 4, to provide an opening between the solder mask opening and the interconnect structure 27 for flow of the underfill material into this region. Accordingly, in the embodiment shown in FIG. 4, there are substantially no voids in the underfill.

What is claimed:

1. A method of making a semiconductor device, comprising:
   providing a first substrate including a first interconnect site;
   providing a second substrate including a second interconnect site comprising a width less than a width of the first interconnect site;
   forming an interconnect structure between the first interconnect site and second interconnect site with the interconnect structure including a tapered profile; and disposing a non-wettable material outside the second interconnect site.

2. The method of claim 1, wherein the interconnect structure includes a bump.

3. The method of claim 1, wherein the interconnect structure includes a non-fusible portion and a fusible portion.

4. The method of claim 3, wherein the non-fusible portion includes lead solder, copper, gold, or nickel.

5. The method of claim 3, wherein the fusible portion includes eutectic solder, tin, silver, copper, or lead.

6. The method of claim 1, further including depositing an underfill material between the first substrate and second substrate.

7. The method of claim 1, wherein the first substrate includes a semiconductor die.

8. The method of claim 1, wherein the first interconnect site includes a die pad or an under bump metallization.

9. The method of claim 1, wherein the interconnect structure includes an elongated bump.

10. A semiconductor device, comprising:
   a first substrate;
   a second substrate; and
   an interconnect structure formed between the first substrate and an interconnect site on the second substrate with the interconnect structure elongated along a length of the interconnect site, wherein the interconnect structure includes a non-fusible portion and a fusible portion.

11. The semiconductor device of claim 10, wherein the interconnect structure includes a tapered profile.

12. The semiconductor device of claim 10, wherein the non-fusible portion includes lead solder, copper, gold, or nickel, and the fusible portion includes eutectic solder, tin, silver, copper, or lead.

13. The semiconductor device of claim 10, further including an underfill material deposited between the first substrate and second substrate.

14. The semiconductor device of claim 10, further including:
   a trace including the interconnect site formed over the second substrate; and
   a non-wettable material disposed over the trace outside the interconnect site.

15. The semiconductor device of claim 10, wherein the interconnect structure includes a bump.

16. A method of making a semiconductor device, comprising:
   providing a first substrate;
   providing a second substrate including a trace;
   forming an interconnect structure between the first substrate and an interconnect site on the trace of the second substrate with the interconnect structure including a first width at the first substrate and a second width less than the first width at the interconnect site; and
   disposing a non-wettable material over the trace outside the interconnect site.

17. The method of claim 16, wherein the interconnect structure includes a bump.

18. The method of claim 16, wherein the interconnect structure includes a non-fusible portion and a fusible portion.

19. The method of claim 18, wherein the non-fusible portion includes lead solder, copper, gold, or nickel.

20. The method of claim 18, wherein the fusible portion includes eutectic solder, tin, silver, copper, or lead.

21. The method of claim 16, further including depositing an underfill material between the first substrate and second substrate.

22. The method of claim 16, wherein the first substrate includes a semiconductor die.

23. The method of claim 16, further including forming a solder mask over the second substrate.

24. The method of claim 23, further including forming an opening in the solder mask, the opening disposed over the interconnect site on the trace.

* * * * *